(12) United States Patent
Harley et al.

(10) Patent No.: US 9,947,812 B2
(45) Date of Patent: Apr. 17, 2018

(54) METALLIZATION OF SOLAR CELLS

(71) Applicant: SUNPOWER CORPORATION, San Jose, CA (US)

(72) Inventors: Gabriel Harley, Mountain View, CA (US); Scott Harrington, Oakland, CA (US); David D. Smith, Campbell, CA (US)

(73) Assignee: SunPower Corporation, San Jose, CA (US)

( * ) Notice: Subject to any disclaimer, the term of this patent is extended or adjusted under 35 U.S.C. 154(b) by 452 days.

(21) Appl. No.: 14/229,759

(22) Filed: Mar. 28, 2014

(65) Prior Publication Data

US 2015/0280029 A1  Oct. 1, 2015

(51) Int. Cl.
*H01L 31/0224* (2006.01)
*H01L 31/068* (2012.01)
*H01L 31/05* (2014.01)

(52) U.S. Cl.
CPC .. *H01L 31/022441* (2013.01); *H01L 31/0516* (2013.01); *H01L 31/0682* (2013.01); *Y02E 10/547* (2013.01)

(58) Field of Classification Search
CPC ......... H01L 31/022441; H01L 31/0682; H01L 31/0516
See application file for complete search history.

(56) References Cited

U.S. PATENT DOCUMENTS 7,339,110 B1    3/2008  Mulligan et al.
8,574,951 B1 *  11/2013 Wang ................ H01L 31/02168
                                                136/256

2005/0176164 A1 *  8/2005  Gee .................... H01L 31/03529
                                                438/48
2010/0037939 A1    2/2010  Eickelmann et al.
2010/0124619 A1    5/2010  Xu et al.
2010/0139764 A1    6/2010  Smith
(Continued)

FOREIGN PATENT DOCUMENTS

CN     202363468 U    8/2012
CN     103493216 A    1/2014
WO    WO-2013/000026  1/2013

OTHER PUBLICATIONS

International Search Report and Written Opinion from PCT/US2015/022334 dated Jun. 19, 2015, 14 pgs.
(Continued)

*Primary Examiner* — Golam Mowla
(74) *Attorney, Agent, or Firm* — Schwabe, Williamson & Wyatt, P.C.

(57) ABSTRACT

Approaches for the metallization of solar cells and the resulting solar cells are described. In an example, a method of fabricating a solar cell involves forming a plurality of alternating N-type and P-type regions in or above a substrate. The method also involves forming a metal seed layer on the plurality of alternating N-type and P-type regions. The method also involves patterning at least a portion of the metal seed layer at regions in alignment with locations between the alternating N-type and P-type regions. The method also involves, subsequent to the patterning, etching to form trenches at the locations between the alternating N-type and P-type regions, isolating the alternating N-type and P-type regions from one another.

19 Claims, 6 Drawing Sheets

(56) References Cited

U.S. PATENT DOCUMENTS

| | | | |
|---|---|---|---|
| 2010/0224251 A1* | 9/2010 | Funakoshi | H01L 31/1804 136/261 |
| 2011/0303280 A1* | 12/2011 | Pawlak | H01L 31/1804 136/256 |
| 2012/0024371 A1* | 2/2012 | Funakoshi | C23C 18/1608 136/256 |
| 2012/0266951 A1 | 10/2012 | Li et al. | |
| 2013/0228218 A1* | 9/2013 | Lee | H01L 31/02244 136/256 |

OTHER PUBLICATIONS

International Preliminary Report on Patentability for PCT Patent Application No. PCT/US2015/022334 dated Oct. 13, 2016, 11 pgs.
Notice of First Office Action from Chinese Patent Application No. 2015800061633 dated Sep. 30, 2017, 8 pgs.

* cited by examiner

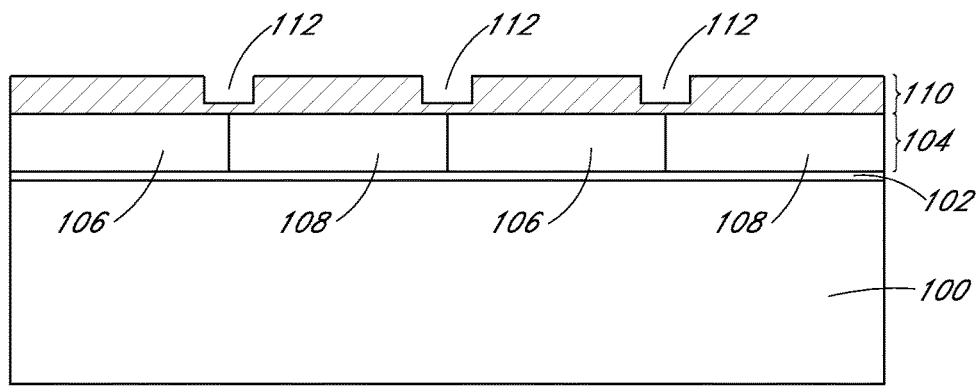
FIG. 1C(ii)
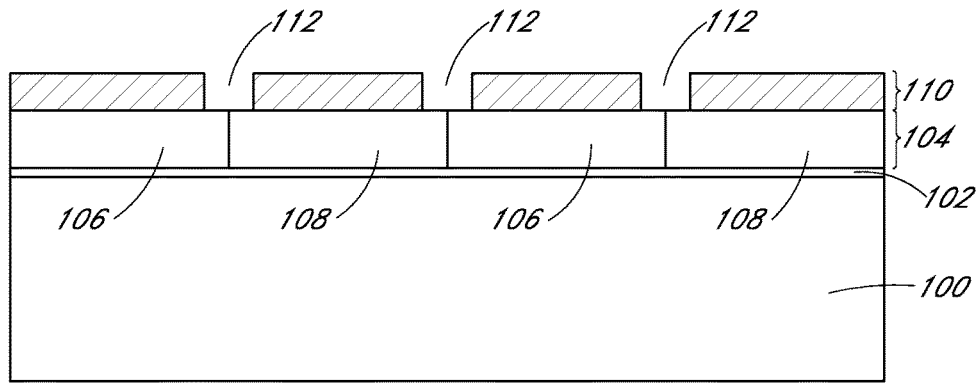
FIG. 1C(iii)
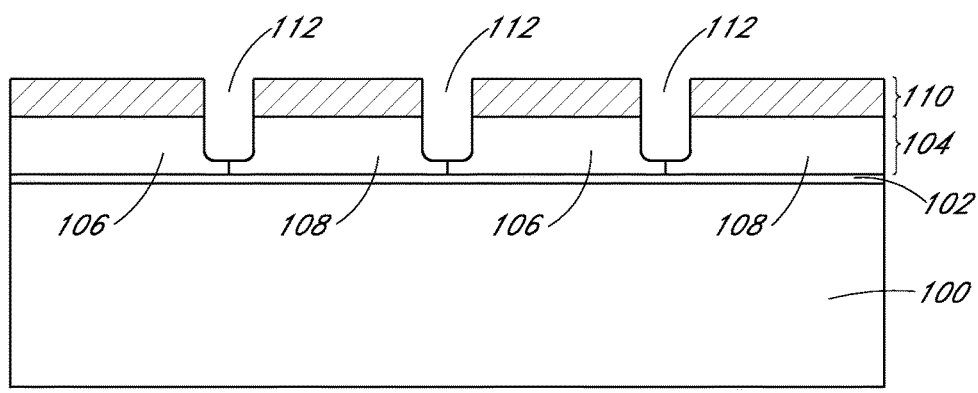
FIG. 1C(iv)

METALLIZATION OF SOLAR CELLS

TECHNICAL FIELD

Embodiments of the present disclosure are in the field of renewable energy and, in particular, include approaches for metallization of solar cells and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIG. 1A illustrates a stage in solar cell fabrication following formation of a plurality of alternating N-type and P-type regions in a semiconductor layer formed above a substrate;

FIG. 1B illustrates the structure of FIG. 1A following formation of a metal seed layer on the semiconductor layer;

FIGS. 1C(i)-1C(iv) illustrate four options for the structure of FIG. 1B following patterning of at least a portion of the metal seed layer at regions in alignment with locations between the alternating N-type and P-type regions;

FIG. 3A illustrates the structure of FIG. 1B following formation of a resist layer on the metal seed layer;

FIG. 3B illustrates the structure of FIG. 3A following patterning of at least a portion of the metal seed layer at regions in alignment with locations between the alternating N-type and P-type regions; and FIG. 3C illustrates the structure of FIG. 3B following formation of trenches in the semiconductor layer at the locations between the alternating N-type and P-type regions, formation of a passivation material in the trenches, and following exposing seed layer portions and plating of contact structures thereon.

FIG. 4A illustrates the structure of FIG. 1B following formation of a metal foil layer on the metal seed layer;

FIG. 4B illustrates the structure of FIG. 4A following patterning of at least a portion of the metal seed layer at regions in alignment with locations between the alternating N-type and P-type regions; and FIG. 4C illustrates the structure of FIG. 4B following formation of trenches in the semiconductor layer at the locations between the alternating N-type and P-type regions and formation of a passivation material in the trenches.

DETAILED DESCRIPTION

Figure 1A:
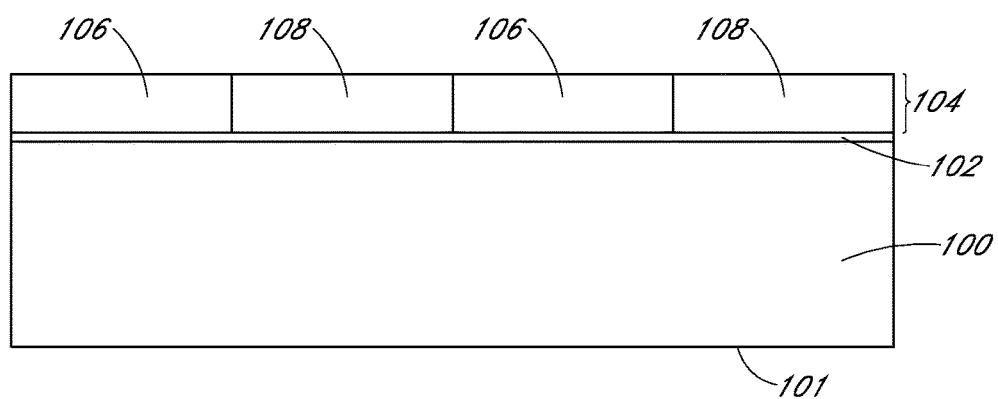
FIGS. 1A, 1B, 1C(i)-1C(iv) and 1D-1F illustrate cross-sectional views of various stages in the fabrication of a solar cell, in accordance with an embodiment of the present disclosure, where.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Approaches for the metallization of solar cells and the resulting solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves forming a plurality of alternating N-type and P-type regions in or above a substrate. The method also involves forming a metal seed layer on the plurality of alternating N-type and P-type regions. The method also involves patterning at least a portion of the metal seed layer at regions in alignment with locations between the alternating N-type and P-type regions. The method also involves, subsequent to the patterning, etching to form trenches at the locations between the alternating N-type and P-type regions, isolating the alternating N-type and P-type regions from one another.

Also disclosed herein are solar cells. In one embodiment, a solar cell includes a substrate. A semiconductor emitter region is disposed in or above the substrate. A contact structure is electrically connected to the semiconductor emitter region and includes a metal seed material disposed on and covering an uppermost surface of the semiconductor emitter region, and a metal foil material disposed on and covering the entire metal seed material.

In another embodiment, a solar cell includes a substrate. A semiconductor emitter region is disposed in or above the substrate. A contact structure is electrically connected to the semiconductor emitter region and includes a metal seed material disposed on and covering an uppermost surface of the semiconductor emitter region and a resist material disposed on the metal seed material, the resist material having an opening formed therein exposing a portion of the metal seed material. The contact structure also includes a metal structure disposed in the opening of the resist material and in contact with the metal seed material.

One or more embodiments described herein are directed to solar cell architectures for integrated metal. Embodiments may involve the use of a texturizing wet etch process to pattern a partially scribed metal seed layer during a silicon trench etch process. Other embodiments involve laser scribing through an entire depth of a metal seed layer. Conventional fabrication schemes may be simplified using approaches described herein. In some embodiment, metallization processing is performed prior to substrate passivation and texturizing operations.

To provide context, back contact solar cell fabrication involving formation of emitter regions above a substrate can be complex and expensive. Additionally, one or more high temperature processing operations are typically affiliated with such processing schemes, e.g., processing at temperatures above 800 degrees Celsius for a phosphorous (P)-drive operation. Such high temperature processing typically precludes the use of metal due to diffusion and contamination in the associated high temperature furnace. Accordingly, conventional processing schemes typically involve metallization after the solar cell has been passivated.

For some high-efficiency back contact, back junction solar cells, the junction formed by the P and N interface is a region of high recombination and must be removed by the formation of a "trench" between the P and N regions, as depicted by 116 in FIG. 1F, described below. The formation of the trench in the Si at the back side also typically requires the passivation of the trench in order to maintain high efficiency. During the subsequent metallization of the active semiconductor, the metal is also patterned and isolated between the P and N regions. A typical etchant for silicon semiconductors is aqueous hydroxide. Metals such as aluminum also etch with this chemistry, and thus need to be protected if present during a etching with this chemistry. However, KOH based chemistry (as an example) may be used during the metallization step to pattern an aluminum metallization. In this example, KOH would be used to pattern and texture the Si during the "front-end," and then later used to pattern the aluminum during the back-end metallization. The result is a sequence of redundant patterning process operations: Si trench formation, masking, etching, contact opening, metal isolation, etc., to form an interdigitated back-contact cell.

In accordance with embodiments of the present disclosure, if the metal is deposited in blanket form prior to the Si trench formation, it is possible to isolate both the P and N regions within the Si, as well as the two polarities of the metal at the same time, and to use the etch chemistry to finish pattering while performing the texturing, and thereby eliminate this redundancy. As such a process may require moving at least part of the metallization sequence prior to passivation, temperatures for passivation operations may be limited, e.g., to less than approximately 400 degrees Celsius. Thus, in accordance with one or more embodiments described herein, low-temperature passivation approaches are described to enable combined emitter/metallization process schemes that eliminate redundant operations.

As described in association with another embodiment, for the solar cell described with both front and back-side texturing due to the presence of the trench, bringing at least part of the metallization sequence before the texture, e.g., by a hydroxide based etch, enables the use of this etching to complete the isolation step, and/or remove the damage caused by the patterning step. Accordingly, potential options for patterning, including use of lasers, are made accessible.

More specifically, embodiments described herein enable simplified metallization schemes which involve low stress, straight forward alignment and, possibly, low temperature (e.g., less than approximately 400 degrees Celsius) processing. In one embodiment, a combined trench and contact mask process scheme facilitates patterning and mitigate risks otherwise associated with trench formation. In one embodiment, formation of a metal seed layer is performed in advance of cell passivation. In that embodiment, the passivation operation may be used to anneal the metal seed layer to provide good adhesion to underlying silicon emitter regions and, possibly, eliminate additional annealing operations. In other embodiments, a metal foil is incorporated into the process flow.

In a first aspect, 1A, 1B, 1C(i)-1C(iv) and 1D-1F illustrate cross-sectional views of various stages in the fabrication of a solar cell, in accordance with an embodiment of the present disclosure. FIG. 2 is a flowchart 200 listing operations in a method of fabricating a solar cell as corresponding to FIGS. 1A, 1B, 1C(i)-1C(iv) and 1D, in accordance with an embodiment of the present disclosure.

Figure 2:
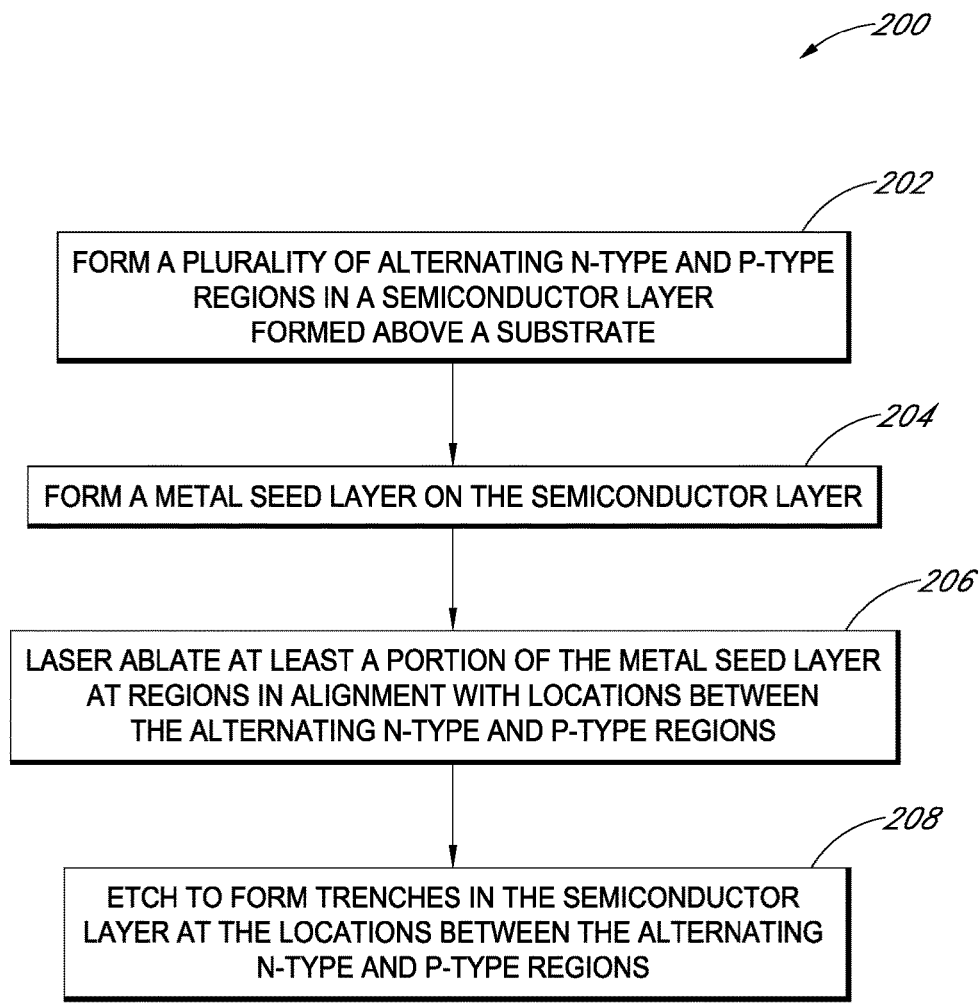
FIG. 2 is a flowchart listing operations in a method of fabricating a solar cell as corresponding to FIGS. 1A, 1B, 1C(i)-1C(iv) and 1D, in accordance with an embodiment of the present disclosure.

FIG. 1A illustrates a stage in solar cell fabrication following formation of a plurality of alternating N-type and P-type regions in a semiconductor layer formed above a substrate. Referring to FIG. 1A and corresponding operation 202 of flowchart 200, a plurality of alternating N-type 106 and P-type 108 regions is formed in a semiconductor layer 104 formed above a substrate 100. In particular, the substrate 100 has disposed there above N-type semiconductor regions 106 and P-type semiconductor regions 108 disposed on a thin dielectric material 102 as an intervening material between the N-type semiconductor regions 106 or P-type semiconductor regions 108, respectively, and the substrate 100. The substrate 100 has a light-receiving surface 101 opposite a back surface above which the N-type semiconductor regions 106 and P-type semiconductor regions 108 are formed.

In an embodiment, the substrate 100 is a monocrystalline silicon substrate, such as a bulk single crystalline N-type doped silicon substrate. It is to be appreciated, however, that substrate 100 may be a layer, such as a multi-crystalline silicon layer, disposed on a global solar cell substrate. In an embodiment, the thin dielectric layer 102 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the semiconductor layer 104 having the plurality of alternating N-type 106 and P-type 108 regions is formed from polycrystalline silicon formed by, e.g., using a plasma-enhanced chemical vapor deposition (PECVD) process. In one such embodiment, the N-type polycrystalline silicon regions 106 are doped with an N-type impurity, such as phosphorus. The P-type polycrystalline silicon regions 108 are doped with a P-type impurity, such as boron.

Figure 1B:
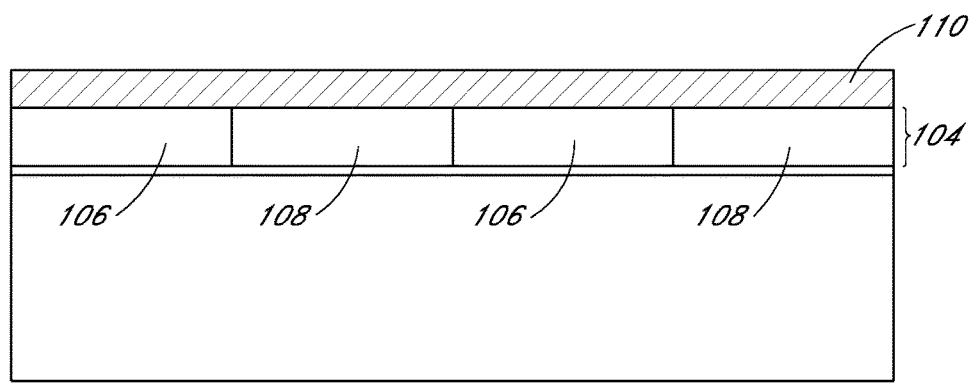

FIG. 1B illustrates the structure of FIG. 1A following formation of a metal seed layer on the semiconductor layer.

Referring to FIG. 1B and corresponding operation 204 of flowchart 200, a metal seed layer 110 is formed on the semiconductor layer 104.

In an embodiment, the metal seed layer 110 includes aluminum in an amount greater than approximately 97% and silicon in an amount approximately in the range of 1-2%. In one such embodiment, the metal seed layer 110 includes a first metal layer including aluminum in an amount greater than approximately 97% and silicon in an amount approximately in the range of 1-2%, a second metal layer including titanium and tungsten (TiW), and a third metal layer including copper. In another embodiment, the metal seed layer 110 includes a first metal layer including aluminum in an amount greater than approximately 97% and silicon in an amount approximately in the range of 1-2%, and a second metal layer including nickel.

In another embodiment, although not depicted, a dielectric layer such as a silicon oxide layer is formed on the semiconductor layer 104 surface, patterned to partially expose the semiconductor layer 104 surface, and then the entire surface is covered in the metal seed layer 110. In that embodiment, the inclusion of a thin oxide layer can enhance optical properties since oxide has a better-matched index of refraction to Si as compared with the metal seed layer.

Figure 1C:
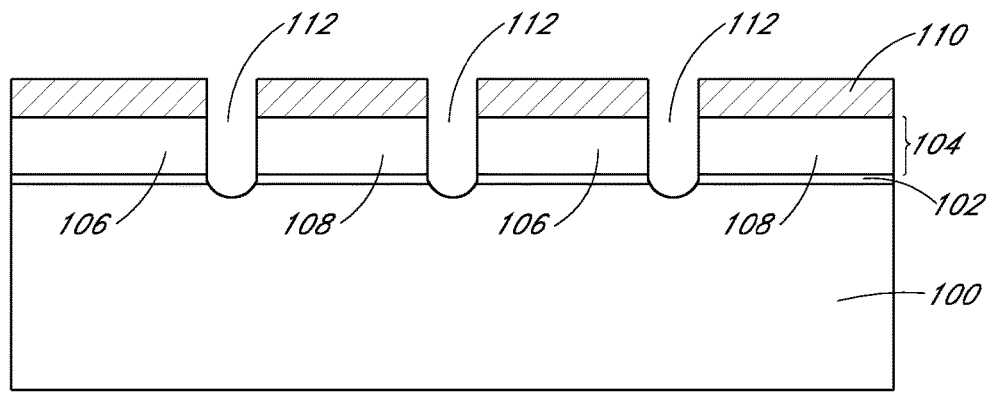

FIGS. 1C(i)-1C(iv) illustrate four options for the structure of FIG. 1B following patterning of at least a portion of the metal seed layer at regions in alignment with locations between the alternating N-type and P-type regions. Referring to FIGS. 1C(i)-1C(iv) and corresponding operation 206 of flowchart 200, at least a portion of the metal seed layer 110 is laser ablated at regions in alignment with locations between the alternating N-type and P-type regions 106 and 108, respectively. The patterning forms trenches 112 between the alternating N-type and P-type regions 106 and 108. In an embodiment, the patterning is achieved by using laser ablation.

With specific reference to FIG. 1C(i), in one embodiment, patterning of the metal seed layer 110 is performed through the entire metal seed layer 110, through the entire semiconductor layer 104 and, possibly, through the thin dielectric material 102 and into the substrate 100. With specific reference to FIG. 1C(ii), in another embodiment, patterning of the metal seed layer 110 is performed through only a portion of the metal seed layer 110. With specific reference to FIG. 1C(iii), in another embodiment, patterning of the metal seed layer 110 is performed through the entire metal seed layer 110 but does not extend into the entire semiconductor layer 104. With specific reference to FIG. 1C(iv), in another embodiment, patterning of the metal seed layer 110 is performed through the entire metal seed layer 110 and extending into, but not through, the semiconductor layer 104.

Figure 1D:
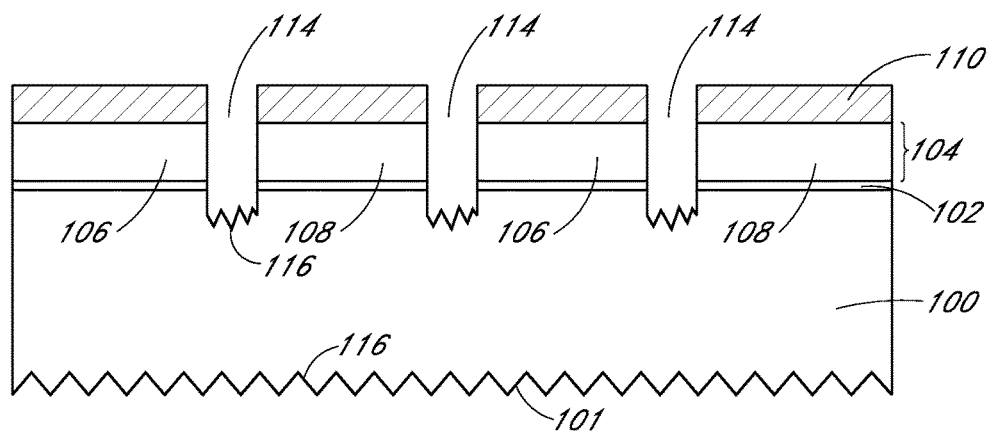
FIG. 1D illustrates the structures of FIGS. 1C(i)-1C(iv) following formation of trenches in the semiconductor layer at the locations between the alternating N-type and P-type regions.

FIG. 1D illustrates the structures of FIGS. 1C(i)-1C(iv) following formation of trenches in the semiconductor layer at the locations between the alternating N-type and P-type regions. Referring to FIG. 1D and corresponding operation 208 of flowchart 200, trenches 114 are formed in the semiconductor layer 104 at the locations between the alternating N-type and P-type regions 106 and 108, isolating the alternating N-type and P-type regions 106 and 108 from one another.

Referring to FIG. 1D, regardless of the extent of the depth of trenches 112, a variety of example of which is shown in FIGS. 1C(i)-1C(iv), trenches 114 are formed through the entire metal seed layer 110, through the entire semiconductor layer 104, through the thin dielectric material 102, and into the substrate 100. In one embodiment, the etching performed to form trenches 114 involves etching using an aqueous hydroxide-based solution. In an embodiment, as depicted in FIG. 1D, etching to form trenches 114 involves texturizing both the light-receiving surface 101 and the bottom of the trenches 114 to form a texturized surface 116. In an embodiment, the etching involves removal of any damage from the patterning process, for example, the heat-affected-zone or any photo-optical damage from laser based patterning, or mechanical damage from any mechanical-based patterning. In an embodiment, a texturized surface may be one which has a regular or an irregular shaped surface for scattering incoming light, decreasing the amount of light reflected off of exposed substrate 100 surfaces of the solar cell. In an embodiment, the metal layer 110 is used as an etch resist during the etching process, to serve as a mask for the etching process. In an embodiment, a relatively thick metal (e.g., greater than approximately 20 microns) is bonded to the metal seed layer, and patterned together with the metal seed layer, such that the thick-metal layer acts as an etch resist. In a specific embodiment, the thickness is selected to account for the portion consumed during the etching, but the final thickness remains sufficient for the electrical and mechanical properties of the finished device.

Figure 1E:
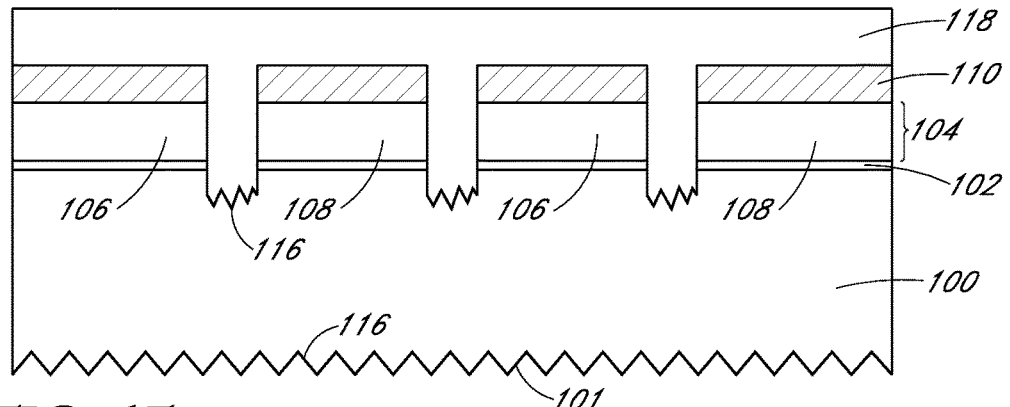
FIG. 1E illustrates the structure of FIG. 1D following formation of a passivation material in the trenches.

FIG. 1E illustrates the structure of FIG. 1D following formation of a passivation material in the trenches. Referring to FIG. 1E, a passivation material layer 118 is formed in the trenches 114 and, in an embodiment, covering the metal seed layer 110. In an embodiment, the passivation material layer 118 is a bottom anti-reflective coating (BARC) material or other passivation material, such as silicon nitride. In an embodiment, the passivation layer further provides the reverse bias breakdown, which is typically obtained through a high-temperature POCl$_3$ diffusion operation. Without such a diffusion step, the trench is not lightly doped and may not provide a break-down path. In order to maintain the reverse bias breakdown in a range less than approximately 5V, passivation materials, such as SiN in combination with a-Si, doped a-Si, AlOx, or other high-band gap dielectrics can be used.

Figure 1F:
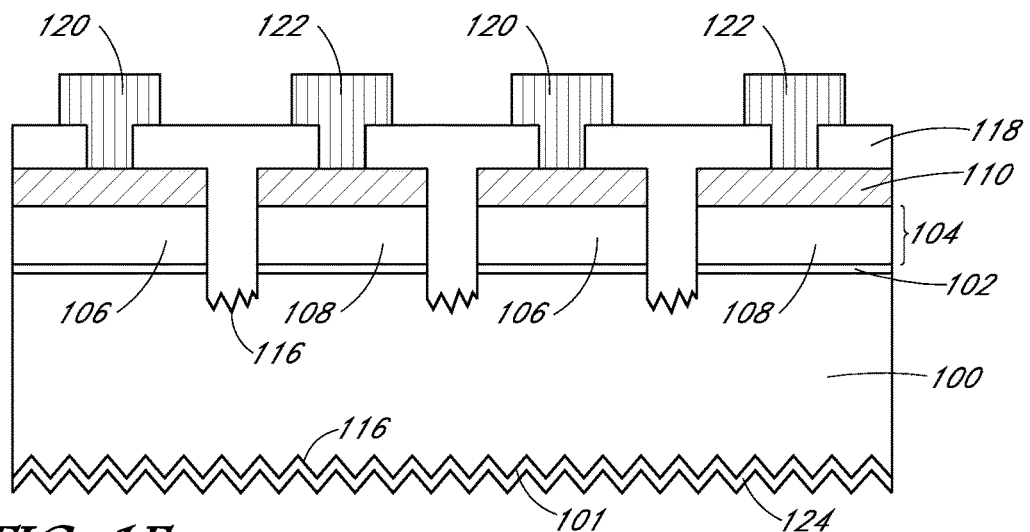
FIG. 1F illustrates the structure of FIG. 1E following exposing seed layer portions and plating of contact structures thereon.

FIG. 1F illustrates the structure of FIG. 1E following exposing seed layer portions and plating of contact structures thereon. Referring to FIG. 1F, metal seed layer portions 110 are exposed by patterning the passivation material layer 118, e.g., by laser ablation. Contact structures 120 for the N-type 106 regions and contact structures 122 for P-type regions 108 are then formed on the exposed portions of the metal seed layer 110, e.g., by plating with copper. Referring again to FIG. 1F, additional embodiments can include formation of a passivation and/or anti-reflective coating (ARC) layers (shown collectively as layer 124) on the light-receiving surface 101. It is to be appreciated that the timing of the formation of passivation and/or ARC layers may vary.

Referring to the structure of FIG. 1F, in an embodiment, a solar cell includes a substrate 100. A semiconductor emitter region 106 or 108 is disposed above the substrate 100. In one embodiment, prior to metallization, the dopants in the semiconductor are activated, e.g., via a thermal or laser operation. In one embodiment, the surface of the semiconductor layer is prepared for contacting to the metal, e.g., by local or blanket removal of any oxide that may be present after any dopant activations. For example, in the case of a thermal activation, there may be presence of a thin-oxide which would be a barrier to metal contact. A contact structure is electrically connected to the semiconductor emitter region 106 or 108 and includes a metal seed material 110 disposed on and covering an uppermost surface of the semiconductor emitter region 106 or 108. A passivation material 118 is disposed on the metal seed material 110. A trench 116 is then formed partially or completely through the seed stack, so as to isolate both the N and P regions of the metal and the semiconductor. The structure is then etched in to texture the trench and the front surface, and remove any damage from the patterning process. The passivation material 118 has an opening formed therein, exposing a portion of the metal seed material 110. The contact structure also includes a metal structure 120 or 122 disposed in the opening of the passivation material 118 and in contact with the metal seed material 110. In one such embodiment, the substrate 100 is an N-type monocrystalline silicon substrate, and the semiconductor emitter region 106 or 108 is an N-type or P-type polycrystalline silicon emitter region. The metal seed material(s) 110 includes a first portion including Ta, Ag, or aluminum in an amount greater than approximately 97% and silicon in an amount approximately in the range of 1-2%. The metal seed layer also includes a second or third portion disposed above the first portion and including titanium and tungsten (TiW) or including nickel. In one embodiment, the top metal seed layer is exposed to an etchant is etch resistant. For hydroxide based etchants, this can include an exposed portion of Ni, Ta, Ag, or the like. The metal structure 120 or 124 includes plated copper, or metal foil (e.g., Al), bonded to the metal seed layer through the passivation layer.

Figure 3A:
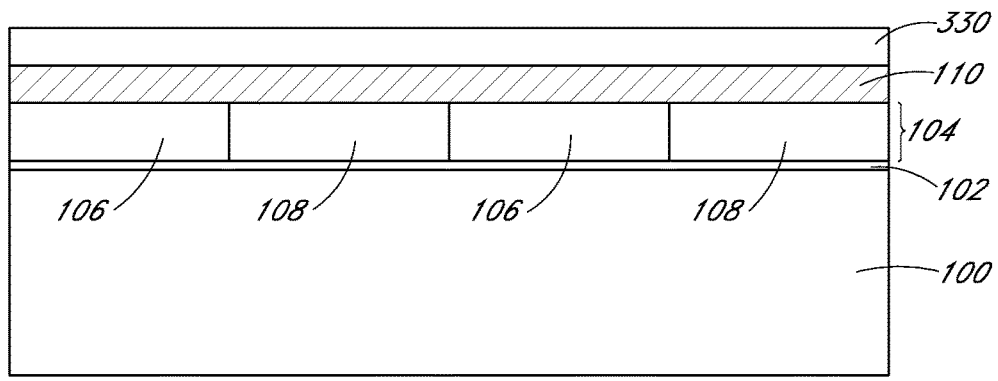
FIGS. 3A-3C illustrate cross-sectional views of various stages in the fabrication of another solar cell, in accordance with another embodiment of the present disclosure, where.
Figure 3B:
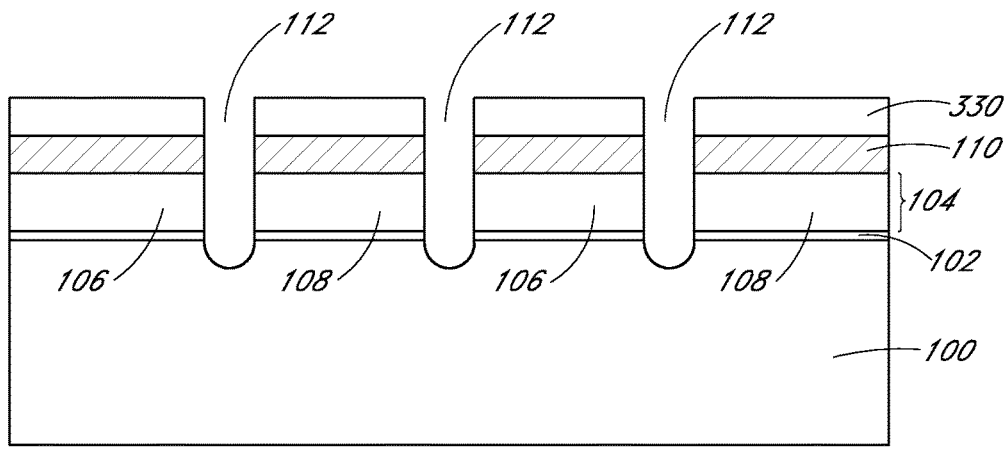
Figure 3C:
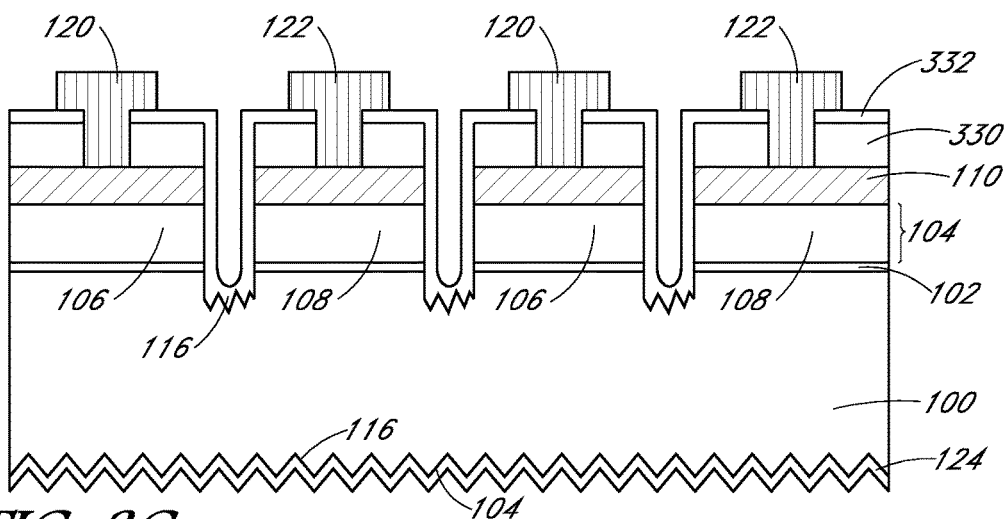

In a second aspect, an resist layer is formed on the metal seed layer prior to patterning the metal seed layer. For example, FIGS. 3A-3C illustrate cross-sectional views of various stages in the fabrication of another solar cell, in accordance with another embodiment of the present disclosure. Formation of a resist layer on top of a metal seed layer enables top-layer seed layer metals (e.g., Al, Cu) that would otherwise be etched within, e.g., a hydroxide based etchant, to survive. In this way, an Al-only seed layer may be deposited, which may be preferable for a subsequent Al-foil bonding step. By contrast, a Cu top seed layer may be preferable for a plating based solution. Also, depending on the passivation material (332) and method of deposition, the resist material 330 can provide protection from corrosion from aggressive gasses. For example, it is known that Cu seed layer layers can be corroded by ammonia-based gases. As ammonia gas may be present in the formation of some passivation layers (e.g., SiN), a top Cu seed layer must be protected during the trench passivation step.

FIG. 3A illustrates the structure of FIG. 1B following formation of an resist layer on the metal seed layer. Referring to FIG. 3A, an resist layer 330 is formed on the metal seed layer 110. In an embodiment, the resist layer 330 is a bottom anti-reflective coating (BARC) material or other passivation material, such as silicon nitride. Other possibilities for materials of the resist layer include oxides, polymers, printed, sprayed, or deposited in sheets.

FIG. 3B illustrates the structure of FIG. 3A following patterning of at least a portion of the metal seed layer at regions in alignment with locations between the alternating N-type and P-type regions. Referring to FIG. 3B, trenches 112 are formed in the resist layer 330 and at least partially into the metal seed layer 110. Although the trenches 112 depicted in FIG. 3B have a depth of similar extent to the depth depicted in FIG. 1C(i), it is to be appreciated that other trench 112 depth extents mat be suitable, such as is described in association with FIGS. 1C(ii)-1C(iv). In an embodiment, the patterning is achieved by using laser ablation.

FIG. 3C illustrates the structure of FIG. 3B following formation of trenches in the semiconductor layer at the locations between the alternating N-type and P-type regions, formation of a passivation material in the trenches, and following exposing seed layer portions and plating of contact structures thereon. Referring to FIG. 3C, trenches (similar to trenches 114 described in association with FIG. 1D) are formed in the semiconductor layer 104 at the locations between the alternating N-type and P-type regions 106 and 108, isolating the alternating N-type and P-type regions 106 and 108 from one another. A passivation material layer 332, which may be similar to passivation material layer 118, is formed in the trenches and, in an embodiment, covering the resist layer 330. Metal seed layer portions 110 are exposed by patterning the passivation material layer 332 and the resist layer 330, e.g., by laser ablation. Alternatively, resist layer 330 may be completely removed prior to passivation, e.g., by ink-strip, if not required for protection of the seed during the passivation step. Contact structures 120 for the N-type 106 regions and contact structures 122 for P-type regions 108 are then formed on the exposed portions of the metal seed layer 110, e.g., by plating with copper. Referring again to FIG. 3C, additional embodiments can include formation of a passivation and/or anti-reflective coating (ARC) layers (shown collectively as layer 124) on the light-receiving surface 101. It is to be appreciated that the timing of the formation of passivation and/or ARC layers may vary.

Referring to the structure of FIG. 3C, in an embodiment, a solar cell includes a substrate 100. A semiconductor emitter region 106 or 108 is disposed above the substrate 100. A contact structure is electrically connected to the semiconductor emitter region (with or without patterned surface oxide) 106 or 108 and includes a metal seed material 110 disposed on and covering an uppermost surface of the semiconductor emitter region 106 or 108. A resist 330 is disposed on the metal seed material 110. A trench is formed at least partially through the resist to isolate the P and N regions in the semiconductor and the metal seed material. An etchant may be used to texture the front, the trench, and remove any residual damage from the trench patterning process. After etching, the trench is passivated with a passivation material such as SiN, doped amorphous Si, AlOx. Next, the resist material 330 and passivation material 332 have an opening formed therein, exposing a portion of the metal seed material 110. The contact structure also includes a metal structure 120 or 122 disposed in the opening of the resist material 330 and in contact with the metal seed material 110. In one such embodiment, the substrate 100 is an N-type monocrystalline silicon substrate, and the semiconductor emitter region 106 or 108 is an N-type or P-type polycrystalline silicon emitter region. The metal seed material 110 includes a first portion including aluminum in an amount greater than approximately 97% and silicon in an amount approximately in the range of 1-2%. The metal seed layer may also include a second portion disposed above the first portion and including titanium and tungsten (TiW) or including nickel. The metal structure 120 or 124 include copper plated in to the openings, as well as other metal deposited or bonded to the metal seed layer, such as Aluminum (printed or laser bonded). In one embodiment, a passivation layer 332 is included over the resist material 330.

In a third aspect, a metal foil layer is formed on the metal seed layer prior to patterning the metal seed layer. For example, FIGS. 4A-4C illustrate cross-sectional views of various stages in the fabrication of another solar cell, in accordance with another embodiment of the present disclosure.

Figure 4A:
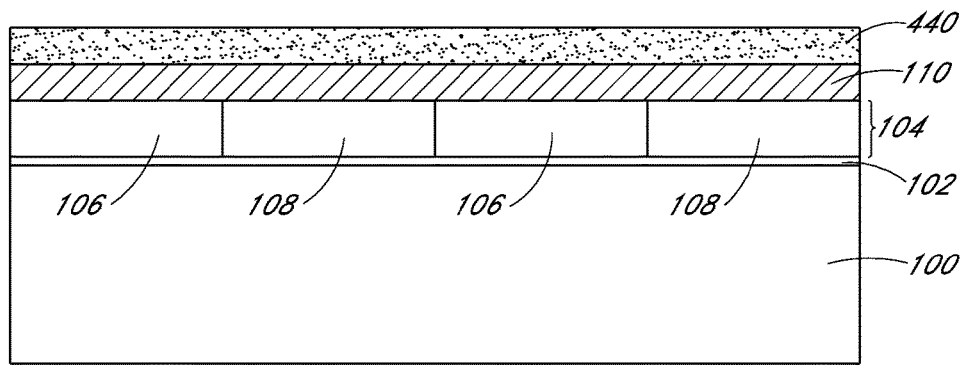
FIGS. 4A-4C illustrate cross-sectional views of various stages in the fabrication of another solar cell, in accordance with another embodiment of the present disclosure, where.

FIG. 4A illustrates the structure of FIG. 1B following formation of a metal foil layer on the metal seed layer. Referring to FIG. 4A, a metal foil layer 440 is formed on the metal seed layer 110.

In an embodiment, the metal foil layer 440 is an aluminum foil layer. In one such embodiment, the metal foil layer 440 is an aluminum (Al) foil having a thickness approximately in the range of 5-100 microns and, preferably, a thickness approximately in the range of 50-100 microns. In an embodiment, the metal foil layer 440 is adhered to the plurality of metal seed material regions 114 by using a technique such as, but not limited to, a laser welding process, a thermal compression process or an ultrasonic bonding process.

Figure 4B:
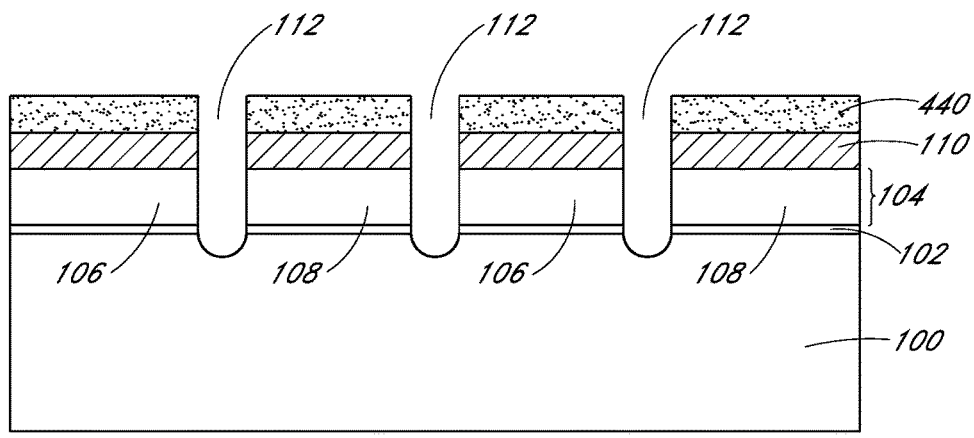
Figure 4C:
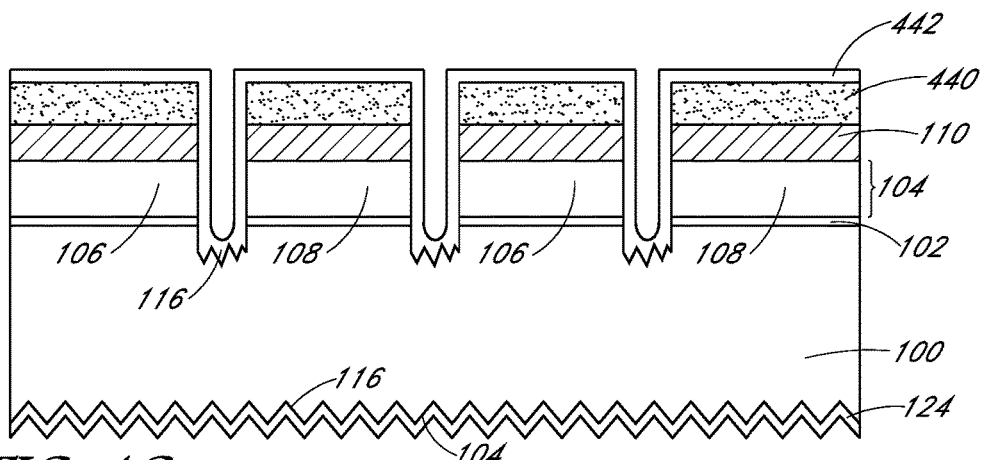

FIG. 4B illustrates the structure of FIG. 4A following patterning of at least a portion of the metal seed layer at regions in alignment with locations between the alternating N-type and P-type regions. Referring to FIG. 4B, trenches 112 are formed in the metal foil layer 440 and at least partially into the metal seed layer 110. Although the trenches 112 depicted in FIG. 4B have a depth of similar extent to the depth depicted in FIG. 1C(i), it is to be appreciated that other trench 112 depth extents mat be suitable, such as is described in association with FIGS. 1C(ii)-1C(iv). In an embodiment, the patterning is achieved by using laser ablation.

FIG. 4C illustrates the structure of FIG. 4B following formation of trenches in the semiconductor layer at the locations between the alternating N-type and P-type regions, formation of a passivation material in the trenches, and following exposing and contacting metal foil layer portions. Referring to FIG. 4C, trenches are formed in the semiconductor layer 104 at the locations between the alternating N-type and P-type regions 106 and 108, isolating the alternating N-type and P-type regions 106 and 108 from one another. A passivation material layer 442, which may be similar to passivation material layer 118, is formed in the trenches and, in an embodiment, covering the metal foil layer 440. It is to be appreciated that additional metal contacts in the traditional sense may not be needed in the foil-based embodiment, since the foil is already the primary conductor and no further metal is needed 'on-cell.' The only contact to the foil that may be required, is for cell to cell interconnection, and for testing. In an embodiment, electrical contact is made to the metal foil layer 440 by piercing portions of the passivation material layer 442.

Referring to the structure of FIG. 4C, in an embodiment, a solar cell includes a substrate 100. A semiconductor emitter region 106 or 108 is disposed above the substrate 100 (with or without the formation of a thin oxide thereon). A contact structure is disposed on the semiconductor emitter region and includes a metal seed material 110 disposed on and covering an uppermost surface of the semiconductor emitter region 106 or 108. A metal foil material 440 is electrically connected to and covers the entire metal seed material 110. In one such embodiment, the substrate 100 is an N-type monocrystalline silicon substrate, the semiconductor emitter region 106 or 108 is an N-type or P-type polycrystalline silicon emitter region, the metal seed material 110 includes aluminum in an amount greater than approximately 97% and silicon in an amount approximately in the range of 1-2%, and the metal foil material 440 is an aluminum metal foil.

Although certain materials are described specifically above with reference to FIGS. 1A, 1B, 1C(i)-1C(iv), 1D-1F, 3A-3C and 4A-4C, some materials may be readily substituted with others with other such embodiments remaining within the spirit and scope of embodiments of the present disclosure. For example, in an embodiment, a different material substrate, such as a group III-V material substrate, can be used instead of a silicon substrate. In other embodiments, the substrate is a monocrystalline silicon substrate, and the alternating N-type and P-type semiconductor regions are formed in the monocrystalline silicon substrate, as opposed to being formed in a polycrystalline silicon layer formed above the substrate. In other embodiments, the above described approaches can be applicable to manufacturing of other than solar cells. For example, manufacturing of light emitting diode (LEDs) may benefit from approaches described herein.

Thus, approaches for the metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a plurality of alternating N-type and P-type regions in or above a substrate;
    forming a metal seed layer on the plurality of alternating N-type and P-type regions;
    patterning only a portion of the metal seed layer at regions in alignment with locations between the alternating N-type and P-type regions; and
    subsequent to the patterning, etching a remainder of the metal seed layer and the alternating N-type and P-type regions to form trenches at the locations between the alternating N-type and P-type regions, isolating the alternating N-type and P-type regions from one another, wherein etching the remainder of the metal seed layer and the alternating N-type and P-type regions is performed using a process different than a process used to pattern only the portion of the metal seed layer.

2. The method of claim 1, further comprising:
    prior to the patterning, forming an aluminum foil layer on the metal seed layer, wherein the patterning further comprises patterning the aluminum foil layer at regions in alignment with the locations between the alternating N-type and P-type regions, leaving remaining portions of the metal seed layer and the aluminum foil layer at regions in alignment with the alternating N-type and P-type regions.

3. The method of claim 2, wherein forming the metal seed layer comprises forming a metal layer comprising aluminum in an amount greater than approximately 97% and silicon in an amount approximately in the range of 1-2%.

4. The method of claim 1, further comprising:
    prior to the patterning, forming a resist layer on the metal seed layer, wherein the patterning further comprises patterning the resist layer at regions in alignment with the locations between the alternating N-type and P-type regions, leaving remaining portions of the metal seed layer and the resist layer at regions in alignment with the alternating N-type and P-type regions.

5. The method of claim 4, wherein forming the metal seed layer comprises forming a first metal layer comprising aluminum in an amount greater than approximately 97% and silicon in an amount approximately in the range of 1-2%, forming a second metal layer comprising titanium and tungsten (TiW), and forming a third metal layer comprising copper.

6. The method of claim 4, further comprising:
    subsequent to etching to form the trenches, patterning the remaining portions of the resist layer to expose regions of the remaining portions of the metal seed layer; and
    plating metal contact features on the exposed regions of the remaining portions of the metal seed layer.

7. The method of claim 1, further comprising:
    forming a passivation material at least in the trenches.

8. The method of claim 7, wherein forming the passivation material further comprises forming the passivation material on remaining portions of the metal seed layer in alignment with the alternating N-type and P-type regions, the method further comprising:
    patterning portions of the passivation material to expose regions of the remaining portions of the metal seed layer; and
    plating metal contact features on the exposed regions of the remaining portions of the metal seed layer.

9. The method of claim 8, wherein forming the metal seed layer comprises forming a first metal layer comprising aluminum in an amount greater than approximately 97% and silicon in an amount approximately in the range of 1-2%, and forming a second metal layer comprising nickel.

10. The method of claim 1, wherein the plurality of alternating N-type and P-type regions is formed in a polycrystalline silicon layer formed on a thin dielectric layer formed on the substrate.

11. The method of claim 1, wherein etching to form the trenches in the semiconductor layer comprises etching using an aqueous hydroxide-based solution.

12. The method of claim 1, wherein patterning at least the portion of the metal seed layer comprises laser ablating the portion of the metal seed layer.

13. A method of fabricating a solar cell, the method comprising:
    forming a plurality of semiconductor regions in or above a substrate;
    forming a metal seed layer on the plurality of semiconductor regions;
    patterning only a portion of the metal seed layer at regions in alignment with locations between the semiconductor regions; and
    subsequent to the patterning, etching a remainder of the metal seed layer and the semiconductor regions to form trenches at the locations between the semiconductor regions, isolating the semiconductor regions from one another, wherein etching the remainder of the metal seed layer and the semiconductor regions is performed using a process different than a process used to pattern only the portion of the metal seed layer.

14. The method of claim 13, further comprising:
prior to the patterning, forming an aluminum foil layer on the metal seed layer, wherein the patterning further comprises patterning the aluminum foil layer at regions in alignment with the locations between the semiconductor regions, leaving remaining portions of the metal seed layer and the aluminum foil layer at regions in alignment with the semiconductor regions.

15. The method of claim 1, further comprising:
prior to the patterning, forming a resist layer on the metal seed layer, wherein the patterning further comprises patterning the resist layer at regions in alignment with the locations between the semiconductor regions, leaving remaining portions of the metal seed layer and the resist layer at regions in alignment with the semiconductor regions.

16. The method of claim 15, wherein forming the metal seed layer comprises forming a first metal layer comprising aluminum in an amount greater than approximately 97% and silicon in an amount approximately in the range of 1-2%, forming a second metal layer comprising titanium and tungsten (TiW), and forming a third metal layer comprising copper.

17. The method of claim 15, further comprising:
subsequent to etching to form the trenches, patterning the remaining portions of the resist layer to expose regions of the remaining portions of the metal seed layer; and
plating metal contact features on the exposed regions of the remaining portions of the metal seed layer.

18. The method of claim 15, further comprising:
forming a passivation material at least in the trenches.

19. The method of claim 18, wherein forming the passivation material further comprises forming the passivation material on remaining portions of the metal seed layer in alignment with the semiconductor regions, the method further comprising:
patterning portions of the passivation material to expose regions of the remaining portions of the metal seed layer; and
plating metal contact features on the exposed regions of the remaining portions of the metal seed layer.

* * * * *